United States Patent
Meek et al.

(10) Patent No.: US 7,148,713 B1
(45) Date of Patent: Dec. 12, 2006

(54) ALGORISTIC SPRING AS PROBE

(75) Inventors: Ronald L. Meek, Shawnee, KS (US); William E. Thurston, Kansas City, MO (US)

(73) Assignee: Interconnect Devices, Inc., Kansas City, KS (US)

( * ) Notice: Subject to any disclaimer, the term of this patent is extended or adjusted under 35 U.S.C. 154(b) by 0 days.

(21) Appl. No.: 11/261,551

(22) Filed: Oct. 28, 2005

(51) Int. Cl.
*G01R 31/02* (2006.01)
(52) U.S. Cl. ........................ 324/761; 324/754
(58) Field of Classification Search ............ None
See application file for complete search history.

(56) References Cited

U.S. PATENT DOCUMENTS

| | | | |
|---|---|---|---|
| 4,051,567 A * | 10/1977 | Hutchinson | 5/260 |
| 5,897,326 A | 4/1999 | Eldridge et al. | |
| 6,245,444 B1 | 6/2001 | Marcus et al. | |
| 6,275,052 B1 | 8/2001 | Hembree et al. | |
| 6,336,269 B1 | 1/2002 | Eldridge et al. | |
| 6,506,082 B1 | 1/2003 | Meek et al. | |
| 6,701,612 B1 | 3/2004 | Khandros et al. | |
| 6,741,085 B1 | 5/2004 | Khandros et al. | |
| 2002/0110761 A1 * | 8/2002 | Fork et al. | 430/322 |

* cited by examiner

*Primary Examiner*—Jermele Hollington
*Assistant Examiner*—Jimmy Nguyen
(74) *Attorney, Agent, or Firm*—Chase Law Firm, L.C.

(57) ABSTRACT

A contact probe including a length of wire with head, coil and tail sections. The head and tail sections may be lengthened and offset from the longitudinal axis of the coil section to allow the probes to be densely packed in a substrate material. Two probes may be interleaved to provide improved electrical performance of the probe.

12 Claims, 2 Drawing Sheets

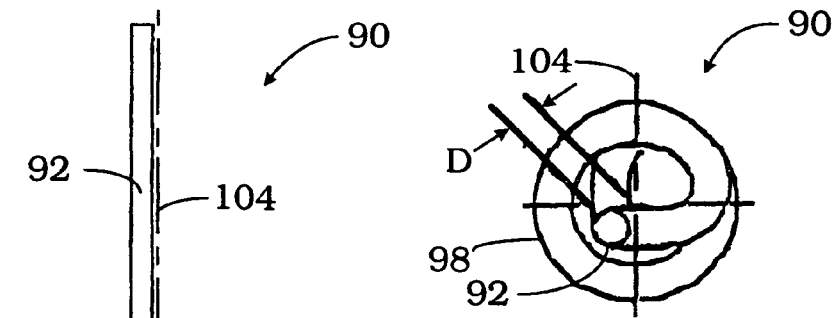
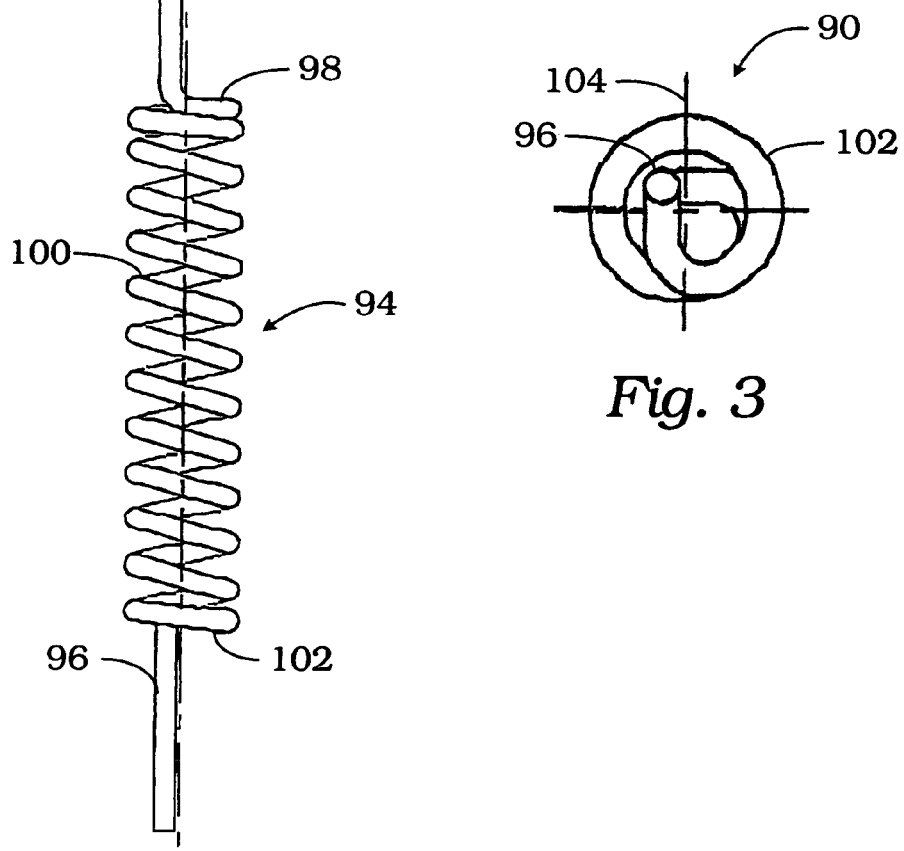

ALGORISTIC SPRING AS PROBE

BACKGROUND OF THE INVENTION

The present invention relates to temporary electrical contacts between electronic components and, more particularly, to very small compliant electrical contacts for circuit board and chip testing.

Compliant electrical contacts or spring probes are generally known in the art. The purpose of these electrical contacts is to provide a temporary or separable electrical interconnection between two electrical conductors. Accordingly, there is no permanent mechanical interconnection between the electrical conductors by such means of soldering or bonding. In order to make a good electrical contact between the probe and the device under test, the probe must include a spring or other resilient and flexible structure. Typically, some form of a spring is used to make the flexible or compliant contact between the components.

Compliant electrical contacts also compensate for irregularities in the contact surface of the device under test. The spring applies a constant contact force at the probe tip to provide a consistent electrical contact.

A typical spring probe consists of a plunger, a spring and a barrel which houses the plunger and spring. The plunger slides within the barrel and is biased outwardly from the barrel by the spring. A spring probe may include a second plunger to provide a probe with two tips which are biased outwardly from each end of the barrel by the spring.

One problem with these types of probes is they have multiple parts that must be assembled together. These probes may fail due to excessive wear between contacting parts. Additionally, these probes are not well suited to high-density application needs of very small integrated circuits of a device under test.

BRIEF SUMMARY OF THE INVENTION

The present invention includes one or more probes which may be densely packed. The compliant probe includes a spring with extended tip or contact portions which allow an intermeshing or overlap of adjacent springs mounted in a substrate. The tip or contact portion may be axially aligned with the longitudinal axis of the spring or may be offset to permit the probes to be densely packed or to permit the springs to be interleaved.

BRIEF DESCRIPTION OF THE DRAWINGS

FIG. 1 is a front elevational view of a probe of the present invention with an offset contact axis.

FIG. 2 is a top view of the probe of FIG. 1.

FIG. 3 is a bottom view of the probe of FIG. 1.

DETAILED DESCRIPTION

Figures 4, 6:
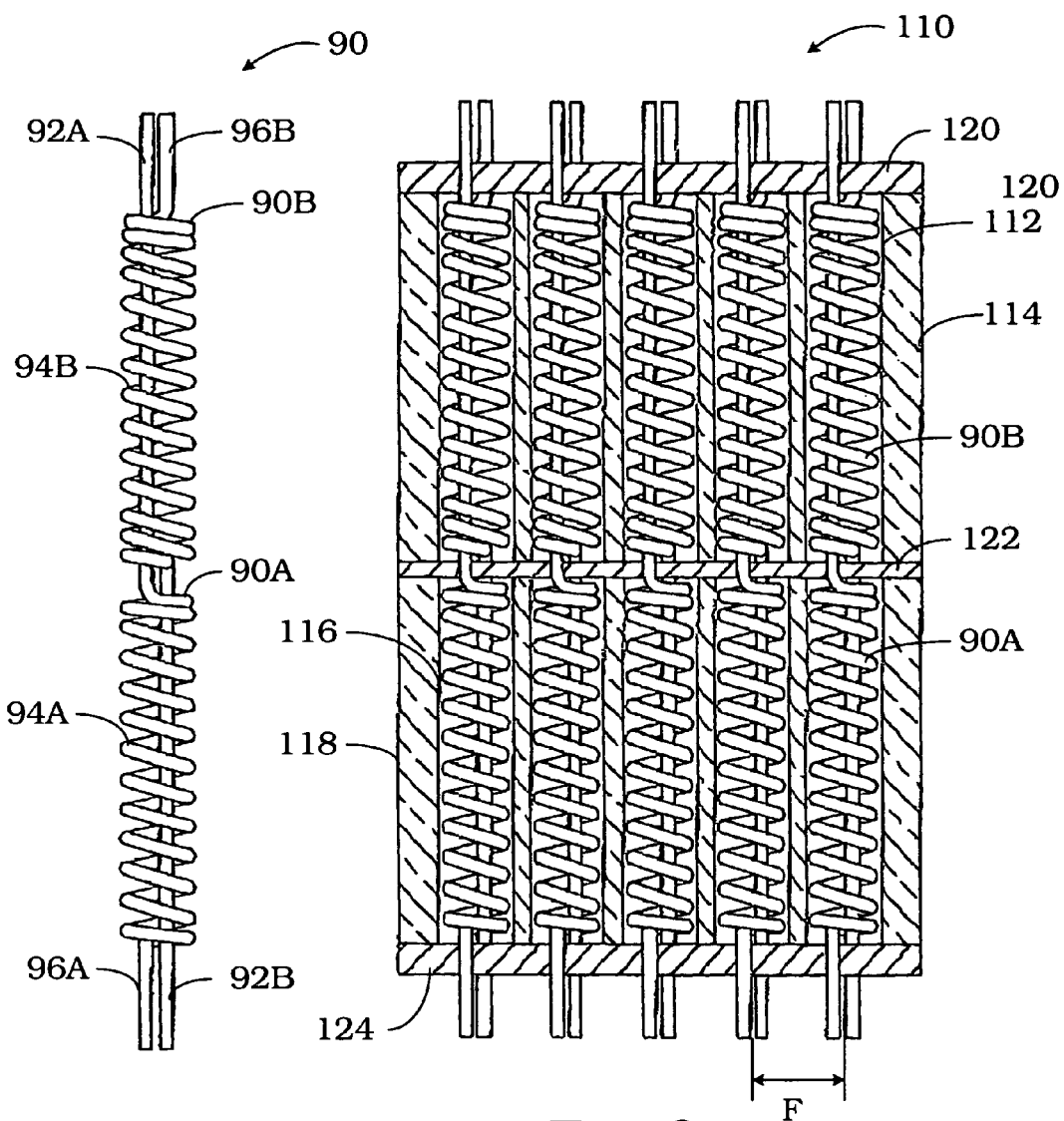
FIG. 4 is a front elevational view of a pair of probes of FIG. 1 interleaved.
FIG. 6 is a sectional view of a plurality of the probes of FIG. 4 densely packed within a substrate.

Referring to FIGS. 1–3, a spring probe is generally indicated by reference numeral 90. Spring probe 90 includes a head 92, a coil 94, and a tail 96. The coil 94 includes an upper closed coil 98, middle or active coils 100, and a lower closed coil 102. The length of the head 92 is approximately equal to the combined length of the coil 94 and tail 96. The length of the probe 90 may be approximately 0.20 inch with a coil diameter of approximately 0.0143 inch. The head 92 and tail 96 portions are in axial alignment and generally parallel to the longitudinal axis 104 of the probe 90. The center-to-center offset D of the head 92 and tail 96 from the longitudinal axis 104 is approximately 0.0025 inch.

Figure 5:
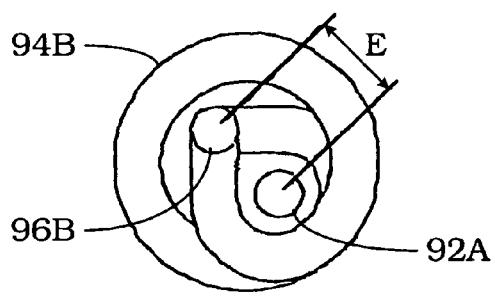
FIG. 5 is an enlarged top view of the probes of FIG. 4.

Referring to FIGS. 4 and 5 a pair of probes 90A and 90B are interleaved with the heads 92A and 92B of each probe 90A and 90B extending through the respective coils 94B and 94A generally parallel to the longitudinal axis 104A and 104B of the probes 90A and 90B.

The center-to-center spacing E of the head 92A of one probe 90A with the tail 96B of the other probe 90B is approximately 0.005 inch. The probes 90A and 90B may each be electrically insulated to provide separate current paths through the probe pair on a very close tip spacing. The close tip spacing E permits Kelvin testing of very small pads of very small devices. The close tip spacing E minimizes the addition of resistance from the solder or other contact material and the resistance of the probe itself may be measured. When the pair of contact tips 92A and 96B of the probe 90 makes electrical contact with the solder or contact material of the device under test, the resistance of the separate probes 90A and 90B may be measured and then subtracted from the resistance measurements taken across the device under test.

Referring to FIG. 6, a plurality of interleaved probes 90A and 90B may be closely packed within a substrate as generally indicated by reference numeral 110. Coil chambers 112 in the upper middle section 114 are sized to accommodate the coils 94B of probes 90B. Likewise, coil chambers 116 in the lower middle section 118 of substrate 110 are sized to accommodate the coils 94A of probes 90A. With the head 92A of probe 90A and the tail 96B of probe 90B extending from the substrate 110, two electrical paths are presented to improve the electrical performance of the probes 90. The center-to-center spacing F of two adjacent interleaved coils may be approximately 0.02 inch.

The coil layers 114 and 116 may be made of Teflon® or other low friction material. The top 120, middle 122 and bottom 124 layers may be made of a high strength insulating material such as ceramic. The probes may be made of a beryllium-copper alloy or other suitable conductive material and may be gold-plated for increased conductivity.

It is to be understood that while certain forms of this invention have been illustrated and described, is it not limited thereto except insofar as such limitations are included in the following claims.

Having thus described the invention, what is claimed as new and desired to be secured by Letters Patent is as follows:

1. A contact probe comprising:
    a first length of wire having a head section, a coil section and a tail section, said head and tail sections extending from said coil in opposite directions as leads;
    said coil section of said first length of wire having a longitudinal axis;
    said head and tail sections of said first length of wire having a longitudinal axis generally parallel to said longitudinal axis of said coil section;
    said head section of said first length of wire having a length of approximately a combined length of said coil and tail sections of said first length of wire,
    a second length of wire having a head section, a coil section and a tail section, said head and tail sections extending from said coil in opposite directions as leads;

said coil section of said second length of wire having a longitudinal axis;

said head and tail sections of said second length of wire having a longitudinal axis generally parallel to said longitudinal axis of said coil section;

said head section of said second length of wire having a length of approximately a combined length of said coil and tail sections of said second length of wire, wherein said first length of wire is interleaved with said second length of wire and wherein said head section of said first length of wire extends through said coil section of said second length of wire along said longitudinal axis of said coil section of said second length of wire, and wherein said head section of said second length of wire extends through said coil section of said first length of wire along said longitudinal axis of said coil section of said first length of wire.

2. The contact probe as set forth in claim 1 wherein said first length of wire is electrically insulated from said second length of wire.

3. A contact probe comprising:

a first spring having a longitudinal axis, a coil section, a head section extending from said coil section and a tail section extending from said coil section opposite said head section, said head section and said tail section generally parallel to said longitudinal axis, a second spring having a longitudinal axis, a coil section, a head section extending from said coil section and a tail section extending from said coil section opposite said head section, said head section and said tail section generally parallel to said longitudinal axis, said first and second springs arranged wherein said coil of said first spring is interleaved with said coil of said second spring, and wherein said longitudinal axis of saif first spring is generally parallel to said longitudinal axis of said second spring.

4. The contact probe as set forth in claim 3 wherein said first spring is electrically insulated from said second spring.

5. The contact probe as set forth in claim 3 wherein said head section of said first spring extends through said coil section of said second spring.

6. The contact probe as set forth in claim 5 wherein said head section of said first spring is electrically insulated from said coil section of said second spring.

7. The contact probe as set forth in claim 5 wherein said head section of said second spring extends through said coil section of said first spring.

8. The contact probe as set forth in claim 7 wherein said head section of said first spring is electrically insulated from said coil section of said second spring and said head section of said second spring is electrically insulated from said coil section of said first spring.

9. The contact probe as set forth in claim 3 wherein said longitudinal axis of said first spring is coincident with said longitudinal axis of said second spring.

10. The contact probe as set forth in claim 3 wherein said head section of said first spring is in axial alignment with said tail section of said second spring.

11. The contact probe as set forth in claim 10 wherein said head section of said second spring is in axial alignment with said tail section of said first spring.

12. The contact probe as set forth in claim 3 wherein said head section of said first spring.

* * * * *

UNITED STATES PATENT AND TRADEMARK OFFICE
CERTIFICATE OF CORRECTION

| | | |
|---|---|---|
| PATENT NO. | : 7,148,713 B1 | Page 1 of 1 |
| APPLICATION NO. | : 11/261551 | |
| DATED | : December 12, 2006 | |
| INVENTOR(S) | : Ronald L. Meek, William E. Thurston and Howard C. Weiner | |

It is certified that error appears in the above-identified patent and that said Letters Patent is hereby corrected as shown below:

Title Page, item (75), please add --Howard C. Weiner, Overland Park, KS (US)--.

Column 4, line 2, delete "saif" and substitute --said--.

Signed and Sealed this

Thirty-first Day of July, 2007

JON W. DUDAS
*Director of the United States Patent and Trademark Office*